United States Patent [19]
Barringer et al.

[11] Patent Number: 4,769,294
[45] Date of Patent: Sep. 6, 1988

[54] ALUMINA MATERIALS FOR LOW TEMPERATURE CO-SINTERING WITH REFRACTORY METALLIZATION

[75] Inventors: Eric A. Barringer, Waltham; Roger S. Lind, Acton; Charles E. Swain, Boston; Ellen S. Tormey, Tyngsboro, all of Mass.

[73] Assignee: Ceramics Process Systems Corp., Cambridge, Mass.

[21] Appl. No.: 935,513

[22] Filed: Nov. 26, 1986

[51] Int. Cl.$^4$ .......................... B32B 9/00; C04B 33/02
[52] U.S. Cl. ....................................... 428/702; 156/89; 264/61; 501/153; 428/469; 428/472.2; 428/689; 428/699
[58] Field of Search ............... 428/688, 689, 699, 701, 428/702, 457, 469, 472.2; 501/153; 423/625; 264/61; 156/89

[56] References Cited

U.S. PATENT DOCUMENTS

| | | | |
|---|---|---|---|
| 2,947,056 | 8/1960 | Csordas et al. | 264/56 |
| 3,241,995 | 3/1966 | Pulfrick et al. | 427/190 |
| 3,698,923 | 10/1972 | Stetson et al. | 264/61 |
| 3,846,146 | 11/1974 | Hunting et al. | 501/119 |
| 3,978,248 | 8/1976 | Usami et al. | 427/96 |
| 4,039,338 | 8/1977 | Swiss et al. | 501/153 |
| 4,071,594 | 1/1978 | Pearson et al. | 264/63 |
| 4,217,337 | 8/1980 | Yamada et al. | 501/153 |
| 4,322,249 | 3/1982 | Claussen et al. | 501/153 |
| 4,480,045 | 10/1984 | Gougouyan et al. | 501/153 |
| 4,540,621 | 9/1985 | Eggerding et al. | 428/269 |
| 4,543,341 | 9/1985 | Barringer et al. | 501/1 |
| 4,601,991 | 7/1986 | Ando et al. | 501/153 |

FOREIGN PATENT DOCUMENTS

| | | | |
|---|---|---|---|
| 0172764 | 2/1986 | European Pat. Off. | 501/153 |
| 0190668 | 8/1986 | European Pat. Off. | 501/153 |
| 2042379 | 3/1971 | Fed. Rep. of Germany . | |
| 1330309 | 5/1963 | France | 501/153 |
| 127660 | 11/1961 | Japan . | |

OTHER PUBLICATIONS

Gattuso–Processing of Narrow Size Distribution.
Mistler et al.—A Theoretical Discussion of Surface Finish of Ceramic Substrates.
Fegley et al.—Synthesis, Characterization, and Processing of Monosized Ceramic Powders, Mat. Res. Soc. Symp. Proc., vol. 32 (1984).

Primary Examiner—George F. Lesmes
Assistant Examiner—James B. Monroe
Attorney, Agent, or Firm—Bradley N. Ruben

[57] ABSTRACT

Substrates consisting of at least 98% narrow size distribution ceramic particles are co-sinterable with metallized paste to which selected compositions of glass have been added. Substrates produced in accordance with the present invention exhibit superior thermal conductivity, low shrinkage variability, and smoother and more homogeneous surface finish.

20 Claims, No Drawings

ALUMINA MATERIALS FOR LOW TEMPERATURE CO-SINTERING WITH REFRACTORY METALLIZATION

This invention relates to ceramic packages for integrated circuits, and in particular, to ceramics which have narrow size distribution particles and which can be co-sintered with metallized pastes at low temperatures.

BACKGROUND ART

Ceramics have found widespread use in electronics as a substrate for integrated circuit packages. Metallized circuit patterns are applied to the ceramic substrate, and ceramic and metallization are co-sintered to create a monolith of substrate and circuitry. Multi-layer circuit packages are constructed by combining ceramic particles and organic binders into unfired, or "green," tape. Inter-layer conductive paths, known as "vias," are then inserted through the layers, forming electrical interconnections between the circuits on each layer after they are stacked and processed. Thereafter, metallized circuit patterns are applied. The tape layers typically have thicknesses ranging from 5 to 25 mils. Holes and notches are formed in the layers as required. Multiple layers of printed tape are stacked and then laminated under pressure, and ceramic and metallization co-sintered to form a monolithic structure with three-dimensional circuitry.

Typically, substrates are formed from a combination of approximately 90–94% commercial, broad size distribution alumina and 6–10% silicon-based glass, and tungsten or molybdenum/manganese paste is used to form the metallized conductive paths. The glass is added to the alumina to promote bonding of the tungsten to the alumina and to provide sintering of the alumina at a lower temperature than for 98+% commercial alumina. Upon co-firing of the alumina and tungsten, the glass component migrates from the alumina layer to the tungsten layer, providing interface adhesion between the paste component and substrate, and promoting bonding. Substrates have typically been formed from particles having a broad size distribution. The prior art suggests that the production of a densely-packed body from particulate material requires the use of a mixture of particles having a broad size distribution. It was thought that a mix of large and small particles was necessary so that small particles would fill the voids between large particles and hence provide maximum packing of particles. Circuit packages produced from prior art formulations typically display a dielectric constant of approximately 9–9.5, thermal conductivity approximately 0.045 cal cm/cm$^2$ sec °C. at 20° C. (compared with 0.085 cal cm/cm$^2$ sec °C. for 99.5% alumina), shrinkage variability of 1.0% (0.5% considered optimal at present), and a surface finish of greater than 25 micro-inches. While these substrate properties may have been acceptable for conventional semiconductor packages, they are inadequate for high-performance large scale integration applications and other specialized applications.

The use of a broad size distribution of particles generally results in non-uniform particle packing within the ceramic tape, which in turn leads to shrinkage variability during the co-firing (sintering) operation. Shrinkage variability exacerbates the problem of meeting critical dimensional tolerances when co-sintering with conductor films. Reducing shrinkage variability is critical for process control and product quality in a broad range of applications, and is especially important as feature size decreases. This is because variability in shrinkage prevents precise location of circuit pads, vias, and other interconnects, and often results in the necessity of rejecting the ceramic circuit packages because of electrical discontinuities between internal interconnects, and, in the case of thin-film applications, additional discontinuities between co-fired metallization and subsequently applied thin-film metallization. A reduction in shrinkage variability from the prior art 1% level would increase product yield, and benefit both the substrate manufacturer and substrate consumer, who, may, for example, require precise positioning of devices and interconnects for reliable post-fire circuit personalization by thin-film metallization.

Surface finish also becomes increasingly important as feature size decreases. In microelectronic circuits produced by thin-film metallization techniques, the conductor thickness can be as small as a few microns (1 micron=40 microinches), so that if the substrate has a 25 microinch surface finish typical of the prior art, the conductor path will have substantial differences in thickness along its length, or may even be discontinuous, with a corresponding degradation of function. Accordingly, roughness of surface finish prevents post-firing circuit personalization by thin-film metallization. The use of a broad size distribution of particles results in a relatively rough surface finish which requires polishing to yield a surface suitable for thin film deposition. Polishing techniques can bring the surface finish to approximately 6–10 microinches, but further improvement through polishing is not possible, because the polishing process plucks larger particles off the surface, leaving voids and increasing porosity. In addition, polishing significantly increases the cost of substrates.

Moreover, porosity of the as-fired surface, especially when combined with surface roughness, leads to the problem of retention of plating salts. Aggressive cleaning procedures are required to avoid deposition of plating where not desired, and to avoid blistering upon firing. Greater smoothness and lack of porosity would allow the use of more active catalysts, which in turn would increase product yield through electroless plating operations.

In addition, an improvement in thermal conductivity would increase heat dissipation and provide a more stable thermal environment for semiconductor devices.

Accordingly, there exists a need for a substrate material with low shrinkage variability, an as-fired surface finish suitable for thin film deposition, and superior thermal characteristics.

DISCLOSURE OF INVENTION

We have discovered that circuit packages can be produced by using a substrate consisting of at least 98% narrow size distribution alumina particles in conjunction with a metallized paste to which selected compositions of glass have been added. This metallized paste is further discussed in our copending application of even date, Ser. No. 935,264, which is hereby incorporated herein by reference. Circuit packages produced in accordance with the present invention exhibit superior thermal conductivity, low shrinkage variability, and smoother and more homogeneous surface finish. Employing narrow size range ceramic powder improves shrinkage and surface finish parameters and reduces sintering temperature. Further details and embodiments of the invention are described below.

DESCRIPTION OF SPECIFIC EMBODIMENTS

A preferred embodiment of the invention utilizes narrow size range alumina powder having a mean particle size in the range of 0.3 to 1.0 micrometer with a standard deviation not greater than approximately 50% of mean. The use of narrow size range alumina particles allows sintering at low temperatures, typically 1500°–1550° C., compared with 1600°–1700° C. for wide size range alumina particles typical of commercial powders. (Because fired ceramics exhibit some grain growth in comparison to starting particle size, a green body beginning with the narrow size range powder described above may exhibit grains having a respective means size in the range of 0.4 to 1.2 micrometers after firing.) Moreover, this lower sintering temperature for narrow size range alumina is achieved without the necessity of adding glass and other sintering aids to the alumina, with its concomitant decrease in thermal conductivity. We have found that throughout a range of particle sizes, the respective thermal conductivities of 92% alumina and 99.5% alumina are 0.045 and 0.085 cal cm/cm$^2$ sec °C. at 20° C., respectively. Alumina substrates produced in accordance with the present invention therefore exhibit nearly double the thermal conductivity of prior art alumina substrates. Using narrow size range alumina particles permits more uniform green densities, and in a 98+% ratio, produces a fired ceramic having an excellent surface finish suitable for thin film deposition. In contrast, typical prior art substrates produced from wide size range 90-94% alumina and 6-10% glass require polishing, which increases cost and creates voids.

Generally, a preferred embodiment of the invention involves the production of a green tape of 98+% narrow size distribution alumina particles, from a slip consisting of a homogeneous mixture of ceramic and organic components. The slip is prepared from sequential additions of dispersed alumina powder, solvent, and plasticized binder which are ball milled for 36-60 hours to a desired viscosity. After de-airing, the slip is delivered to a carrier material where a doctor blade levels it to a constant thickness which will shrink to a calculated thickness after solvent evaporation.

A wide variety of slip constituents will produce an acceptable tape. Typical solvent systems consist of combinations of: cyclohexanone, ethanol, methyl ethyl ketone, methanol, toluene, and xylene. Different polyvinyl butyral resins are used such as: B-76, B-79, B-90, and B-98 [polyvinyl Butyral, Monsanto, St. Louis, MO] generally having a weight average molecular weight of about 30,000 to about 55,000 and further described in Monsanto publication number 6070E. Effective plasticizers are: dibutylphthalate, dioctylphthalate, and mixed phthalates (PX-316 and PX-126) [Phthalate, USS Chemicals, Pittsburgh, PA]. Other plasticizers may be usefully employed. Binder additions are in the range of 38 to 44 volume percent with polymer to plasticizer ratios ranging fom 1.5:1 to 4:1 depending on the laminating, punching, and shrinkage characteristics desired. Typically, the slip is prepared in a two stage milling process. In the first stage, the ceramic powder, solvent(s), and dispersant(s) are mixed. In the second stage, the polymer(s) and plasticizer(s) are added.

In a further preferred embodiment, multi-layer circuit packages are constructed by combining layers of ceramic tape to which are applied metallized circuit patterns. The tape layers typically have thicknesses ranging from 5 to 30 mils (125–765 micrometers). Vias are inserted through the layers, and notches are formed in the layers as required. The layers are then laminated under pressure, and ceramic and metallization co-sintered. Typical co-sintering operation involves heating the laminate to 1200° C. and maintaining this temperature for 1-3 hours, and thereafter heating the laminate to the peak firing temperature (typically 1500°–1550° C.) and maintaining this temperature for ½-2 hours in an atmosphere of dissociated ammonia and nitrogen (50% H$_2$ and 50% N$_2$) and water vapor at a dew point ranging from 15°–45° C.

The following examples are illustrative of the invention:

In each of the examples below, the slip is milled in two 24 hour stages. In the first stage the powder, solvents, and a small amount (about 8-15% of the total) of polymer are milled to ensure good dispersion of the powder in the liquid phase. The second stage of milling is done with the addition of the rest of the polymer and plasticizer.

EXAMPLE 1

| Component | | Weight Percent |
| --- | --- | --- |
| Stage I Milling: | | |
| Ceramic powder | alumina (average 0.5 micrometers, standard deviation 0.15) | 58 |
| Solvent | methyl ethyl ketone | 16 |
| Solvent | toluene | 16 |
| Polymer | Polyvinyl Butyral B-79 | 0.7–1.1 |
| Stage II Milling: | | |
| Polymer | Polyvinyl Butyral B-79 | 5.9–6.3 |
| Plasticizer | Phthalate PX-316 | 3 |

EXAMPLE 2

| Component | | Weight Percent |
| --- | --- | --- |
| Stage I Milling: | | |
| Ceramic powder | alumina (average 0.5 micrometers, standard deviation 0.15) | 56 |
| Solvent | methyl ethyl ketone | 17 |
| Solvent | toluene | 17 |
| Polymer | Polyvinyl Butyral B-79 | 0.8–1.2 |
| Stage II Milling: | | |
| Polymer | Polyvinyl Butyral B-79 | 6.8–7.2 |
| Plasticizer | Phthalate PX-316 | 2 |

EXAMPLE 3

| Component | | Weight Percent |
| --- | --- | --- |
| Stage I Milling: | | |
| Ceramic powder | alumina (average 0.5 micrometers, standard deviation 0.15) | 55 |
| Solvent | ethanol | 13 |
| Solvent | xylene | 20 |
| Polymer | Polyvinyl Butyral | 0.6–0.9 |

| Component | | Weight Percent |
|---|---|---|
| | B-90 | |
| Stage II Milling: | | |
| Binder | Polyvinyl Butyral B-90 | 5.1–5.4 |
| Plasticizer | dibutylphthalate | 6 |

EXAMPLE 4

| Material | Composition | Weight Percent |
|---|---|---|
| Stage I Milling: | | |
| Ceramic powder | Alumina | 57.5 |
| Solvent | Toluene | 15.7 |
| Solvent | Methyl Ethyl Ketone | 15.7 |
| Polymer | Polyvinyl Butyral B-79 | 0.6 |
| Dispersant | Triethanolamine | 0.3 |
| Stage II Milling: | | |
| Polymer | Polyvinyl Butyral B-79 | 6.9 |
| Plasticizer | Dibutyl Phthalate | 3.3 |

These tapes typically yield a green-to-fired shrinkage variation of less than ±0.25% at firing temperatures in range of 1510°–1540° C. and density of >98% of theoretical.

Colorants, such as MnO, $MoO_3$, or $TiO_2$, or a combination thereof, may be added in amounts up to approximately 2% by weight to opacify the fired ceramic, while preserving the advantageous characteristics of the invention, although lesser amounts (for example, 0.1% $MoO_3$) may suffice.

What is claimed is:

1. An as-fired ceramic substrate consisting essentially of at least 98% densely packed, narrow size distribution alumina grains having a mean grain size in the range of 0.4 to 1.2 microns with a standard deviation not exceeding approximately 50% of the mean and not less than about 20% of the mean, the substrate derived from crystalline powders.

2. A substrate according to claim 1, wherein the alumina grains have a mean grain size in the range of 0.4 to 1.2 microns with a standard deviation not exceeding approximately 50% of the mean and not less than about 30% of the mean.

3. A substrate according to claim 1, characterized by a surface finish of not more than 3.0 microinch.

4. An as-fired multi-layer laminated ceramic-based circuit package comprising:
layers of ceramic substrate, each layer consisting essentially of at least 98% densely packed, narrow size distribution alumina grains having a mean grain size in the range of 0.4 to 1.2 microns with a standard deviation not exceeding approximately 50% of the mean and not less than about 20% of the mean, the substrate derived from crystalline powders; and
at least one conductive layer interspersed between the alumina layers.

5. A circuit package according to claim 4, wherein the alumina grains have a mean grain size in the range of 0.4 to 1.2 microns with a standard deviation not exceeding approximately 50% of the mean and not less than about 30% of the mean.

6. A circuit package according to claim 4, wherein the substrates are characterized by a surface finish of not worse than 3.0 microinch.

7. A slip consisting essentially of crystalline alumina particles having a narrow particle size distribution by exhibiting a mean particle size in the range of 0.3 to 1.0 microns with a standard deviation not exceeding approximately 50% of the mean and not less than about 20% of the mean, a solvent system, a binder resin, and a plasticizer.

8. A slip according to claim 7, wherein the alumina particles have a mean particle size in the range of 0.3 to 1.0 micron with a standard deviation not exceeding approximately 50% of the mean and not less than about 30% of the mean.

9. A slip according to claim 7, wherein the plasticizer is selected from the group consisting of dibutylphthalate, dioctylphthalate, and mixed phthalates.

10. A slip according to claim 7, wherein the solvent system is a mixture of components selected from the group consisting of cyclohexanone, ethanol, methyl ethyl ketone, methanol, toluene, and xylene.

11. A slip according to claim 7, wherein the binder resin is polyvinyl butyral.

12. A slip according to claim 11, wherein the polyvinyl butyral resin has a weight average molecular weight of from about 30,000 to about 55,000.

13. A process for producing a ceramic substrate, comprising;
(a) forming a slip consisting essentially of crystalline alumina particles having a narrow size distribution and exhibiting a mean particle size in the range of 0.3 to 1.0 microns with a standard deviation not exceeding approximately 50% of the mean and not less than about 20% of the mean, a solvent system, a binder resin, and a plasticizer;
(b) forming a tape from the slip by permitting the solvent system to evaporate; and
(c) firing the tape.

14. A process according to claim 13, wherein the particles employed in step (a) have a mean particle size in the range of 0.3 to 1.0 micron with a standard deviation not exceeding approximately 50% of the mean and not less than about 30% of the mean.

15. A process according to claim 13, wherein the plasticizer employed in step (a) is selected from the group consisting of dibutylphthalate, dioctylphthalate, and mixed phthalates.

16. A process according to claim 13, wherein the solvent system employed in step (a) is a mixture of components selected from the group consisting of cyclohexanone, ethanol, methyl ethyl ketone, methanol, toluene, and xylene.

17. A process according the claim 13, wherein the binder resin is polyvinyl butyral.

18. A process according to claim 17, wherein the polyvinyl butyral resin employed in step (a) has a weight average molecular weight of from about 30,000 to about 50,000.

19. A process for producing a ceramic substrate, comprising:
(a) forming a slip consisting essentially of crystalline alumina particles having a mean particle size in the range of from about 0.3 to about 1.0 micron with a standard deviation not exceeding approximately 50% of the mean and not less than about 20% of the mean, a solvent system, a binder resin, and a plasticizer by (i) milling the alumina particles, the solvent, the binder, and triethanolamine to produce a dispersion, and thereafter (ii) milling the dispersion with additional binder and the plasticizer;

(b) forming a tape from the slip by permitting the solvent system to evaporate; and
(c) firing the tape to produce an alumina ceramic substrate.

20. The process as defined by claim 19, wherein the binder comprises polyvinyl butyral.

* * * * *